United States Patent
Johnson (10) Patent No.: US 10,066,820 B2
(45) Date of Patent: Sep. 4, 2018

(54) WALL MOUNTED BATTERY-POWERED WIRELESS DEVICE

(71) Applicant: ABL IP HOLDING LLC, Conyers, GA (US)

(72) Inventor: John Richard Johnson, Flowery Branch, GA (US)

(73) Assignee: ABL IP HOLDING LLC, Conyers, GA (US)

(*) Notice: Subject to any disclaimer, the term of this patent is extended or adjusted under 35 U.S.C. 154(b) by 44 days.

(21) Appl. No.: 15/207,911

(22) Filed: Jul. 12, 2016

(65) Prior Publication Data
US 2018/0017242 A1    Jan. 18, 2018

(51) Int. Cl.
*F21V 23/04* (2006.01)
*H05K 5/02* (2006.01)

(52) U.S. Cl.
CPC ....... *F21V 23/0435* (2013.01); *H05K 5/0204* (2013.01)

(58) Field of Classification Search
None
See application file for complete search history.

(56) References Cited

U.S. PATENT DOCUMENTS

| | | |
|---|---|---|
| 3,168,612 A | 2/1965 | Sorenson |
| 5,239,205 A * | 8/1993 | Hoffman ............... H01H 23/00 200/277.2 |
| 6,355,885 B1 * | 3/2002 | Rintz ..................... H01H 9/18 174/66 |
| 6,376,770 B1 * | 4/2002 | Hyde ..................... H02G 3/123 174/50 |
| D529,787 S | 10/2006 | Swiencicki et al. |
| 7,225,972 B2 * | 6/2007 | Kawamata ............. G08C 17/00 235/375 |
| 7,456,358 B2 | 11/2008 | Swiencicki et al. |
| 7,538,285 B2 * | 5/2009 | Patel .................... H01H 13/705 200/314 |
| 7,582,830 B2 | 9/2009 | Claffy |
| 7,656,308 B2 * | 2/2010 | Atkins .................. G08C 17/02 315/312 |
| 8,072,766 B2 * | 12/2011 | Shimura ............. G07C 9/00944 174/359 |
| 8,289,716 B2 * | 10/2012 | Patel ..................... H01H 3/122 361/728 |
| 8,389,857 B2 * | 3/2013 | Petrillo ................ H05B 39/088 174/50 |
| 8,420,956 B2 | 4/2013 | Alderson et al. |
| 8,629,349 B2 | 1/2014 | Martino et al. |
| 8,854,798 B1 * | 10/2014 | Mullet .................... H02G 3/14 175/50 |

(Continued)

OTHER PUBLICATIONS

Canadian Office Action for Canadian Application No. 2,972,369, dated Jul. 17, 2018, 4 pages.

*Primary Examiner* — Xanthia C Cunningham
(74) *Attorney, Agent, or Firm* — RatnerPrestia (57) ABSTRACT

A battery-powered wireless electronic device includes a housing defining an interior space including a battery compartment in which one or more batteries are removably mounted. A wireless transmitter is positioned within the interior space of the housing and is electrically connected to obtain power from the one or more batteries for transmitting a wireless signal. A connector is disposed on the housing for releasably connecting the battery-powered wireless electronic device to a wall mount that is fixedly mounted at least partially inside of the wall.

11 Claims, 4 Drawing Sheets

(56) References Cited

U.S. PATENT DOCUMENTS

| | | | | |
|---|---|---|---|---|
| 9,024,800 B2* | 5/2015 | Altonen | | H01H 9/025 341/176 |
| 9,208,965 B2* | 12/2015 | Busby | | H02G 3/14 |
| 9,538,620 B2* | 1/2017 | Kim | | F21K 9/23 |
| 9,589,461 B1* | 3/2017 | Byrne | | G08C 19/00 |
| 9,633,557 B2* | 4/2017 | Dimberg | | G08C 17/02 |
| 9,743,497 B2* | 8/2017 | Keirstead | | H05B 37/0272 |
| 9,750,115 B2* | 8/2017 | Keller | | H05B 37/0272 |
| 9,818,559 B2* | 11/2017 | Tress | | H05B 37/0272 |
| 2003/0119567 A1 | 6/2003 | Lin | | |
| 2005/0285538 A1* | 12/2005 | Jaworski | | A61L 9/037 315/76 |
| 2006/0000971 A1* | 1/2006 | Jones | | G08B 25/00 250/239 |
| 2006/0044154 A1* | 3/2006 | Liao | | G08C 23/04 340/13.24 |
| 2008/0296296 A1* | 12/2008 | Anders | | H01H 23/04 220/4.02 |
| 2009/0102679 A1* | 4/2009 | Schoettle | | G08B 7/064 340/815.4 |
| 2011/0272261 A1* | 11/2011 | Johnson | | H01H 23/02 200/339 |
| 2012/0104197 A1* | 5/2012 | Jensen | | F16M 13/02 248/205.1 |
| 2013/0002687 A1* | 1/2013 | Conti | | F21V 23/0435 345/501 |
| 2014/0056010 A1* | 2/2014 | Devlin | | F21S 8/038 362/418 |
| 2014/0132475 A1* | 5/2014 | Bhutani | | H01Q 9/42 343/866 |
| 2014/0341413 A1* | 11/2014 | McKeough | | H04R 1/00 381/334 |
| 2015/0349973 A1* | 12/2015 | Camden | | H01Q 13/10 340/12.5 |
| 2015/0357133 A1* | 12/2015 | Keirstead | | H01H 23/04 200/339 |
| 2017/0201725 A1* | 7/2017 | Siminoff | | H04N 7/186 |
| 2017/0207042 A1* | 7/2017 | Tress | | H01H 23/04 |

* cited by examiner

WALL MOUNTED BATTERY-POWERED WIRELESS DEVICE

TECHNICAL FIELD

The present subject matter relates to a wall mount for releasably mounting a battery powered electronic device in a wall.

BACKGROUND

Battery-powered wireless wall switches are becoming increasingly more common as users seek to adopt intelligent lighting systems in the interest of lowering installation costs and reducing lighting energy consumption. One drawback of a battery-powered wall switch is that the batteries eventually require replacement by the user. It would be beneficial to make the process of changing the batteries as convenient as possible for the user.

SUMMARY OF THE INVENTION

According to one aspect of the invention, a battery-powered wireless electronic device comprises a housing defining an interior space including a battery compartment in which one or more batteries are removably mounted. A wireless transmitter is positioned within the interior space of the housing and electrically connected to obtain power from the one or more batteries for transmitting a wireless signal. A connector is disposed on the housing for releasably connecting the battery-powered wireless electronic device to a wall mount that is fixedly mounted at least partially inside of the wall.

According to another aspect of the invention, a battery-powered wireless electronic device assembly comprises a battery-powered wireless electronic device including a housing defining an interior space including a battery compartment in which one or more batteries are removably mounted. A wireless transmitter is positioned within the interior space of the housing and electrically connected to the one or more batteries for transmitting a wireless signal. A battery compartment cover is removably connected to the housing for enclosing the battery compartment. The battery-powered wireless electronic device assembly further comprises a wall mount for releasably mounting the battery-powered wireless device at least partially inside of a wall.

According to yet another aspect of the invention, a battery-powered wireless electronic device assembly comprises a battery-powered wireless electronic device including a housing defining an interior space including a battery compartment in which one or more batteries are removably mounted. A wireless transmitter is positioned within the interior space of the housing and electrically connected to the one or more batteries for transmitting a wireless signal. A battery compartment cover is removably connected to the housing for enclosing the battery compartment. A ramp is disposed on an exterior surface of the housing. The battery-powered wireless electronic device assembly further comprises a wall mount for releasably mounting the battery-powered wireless electronic device at least partially inside of a wall. The wall mount includes a housing structure for receiving the battery-powered wireless electronic device and an opening provided in a wall of the housing structure for releasably engaging with the ramp.

BRIEF DESCRIPTION OF THE DRAWINGS

The drawing figures depict one or more implementations in accord with the present concepts, by way of example only, not by way of limitations. In the figures, like reference numerals refer to the same or similar elements. The figures are not drawn to scale, and all of the figures are shown schematically.

DETAILED DESCRIPTION

In the following detailed description, numerous specific details are set forth by way of examples in order to provide a thorough understanding of the relevant teachings. However, it should be apparent to those skilled in the art that the present teachings may be practiced without such details. In other instances, well known methods, procedures, components, and/or circuitry have been described at a relatively high-level, without detail, in order to avoid unnecessarily obscuring aspects of the present teachings. The various examples disclosed herein relate to a battery-powered wireless electronic device that is configured to be releasably mounted to a wall mount. Reference now is made in detail to the examples illustrated in the accompanying drawings and discussed below.

FIGS. 1-4 depict an example of an assembly 10 that includes a battery powered wireless electronic device and a wall mount that provides detachable mounting to a wall yet facilitates removal for battery replacement. This first example of the assembly 10 includes a battery-powered wireless wall switch 11 (hereinafter referred to as switch 11) as the battery-powered wireless electronic device and a wall mount 13 that enables removably mounting the switch 11 to a wall. According to the example, the switch 11 is used to wirelessly control one or more lighting fixtures (for example) that are both remote from and physically disconnected from or not electrically wired to the switch 11.

In another example, battery-powered wireless electronic device is not a switch 11 at all. The wireless electronic device used with the wall mount 13 may be any battery powered wireless electronic device intended to be mounted on a wall or the like, such as a keypad, buzzer, motion sensor, occupancy sensor, ambient light sensor, switch, speaker, microphone, camera, or light, for example.

Figure 4:
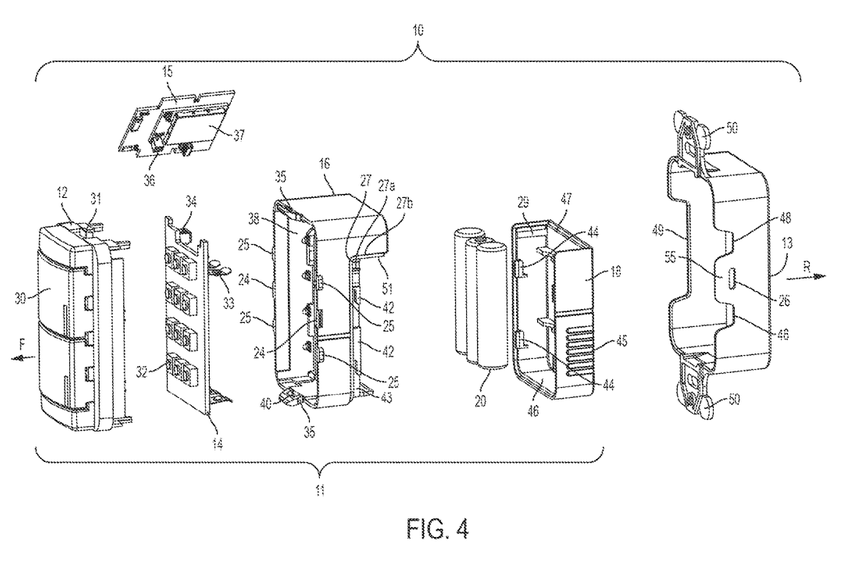
FIG. 4 depicts an exploded view of the battery-powered wireless wall switch and wall mount therefor.

The switch 11 includes a button assembly 12 for controlling operation of the switch 11 and a rear enclosure 16 that is fixedly mounted to the button assembly 12. The device also includes electronics to implement its intended functions, in the example, to function as a wireless wall switch for control of light fixtures or other luminaires. Hence, the switch 11 includes a button circuit board assembly 14 and a radio circuit board assembly 15. Each of the assemblies 14, 15 is mounted within an interior space defined within the rear enclosure 16. One or more batteries 20 (three shown) for powering the circuit board assemblies 14 and 15 are also mounted within the interior space of the rear enclosure 16. The batteries 20 may be standard AA batteries or AAA batteries, for example. A battery compartment cover 18 is removably mounted to the rear end of the rear enclosure 16.

The switch 11 is removably connected to the wall mount 13 by a connector 24 and slot 26 arrangement, as will be described in greater detail later, and without the need for additional fasteners such as screws or bolts. In use, the wall mount 13 is fixedly mounted to a wall by one or more fasteners (not shown) that pass through upper and lower openings 54 in the wall mount 13.

Referring now to the individual components of the switch 11, button assembly 12 includes one or more depressible buttons 30 (two shown) on its front facing surface for activating and deactivating the switch 11. Alternatively, the buttons 30 could be replaced by one or more switches, touch-sensitive surfaces, toggles, or any other mechanism that is known to those skilled in the art. Buttons 30 may be generally referred to as a user-operated mechanism for controlling the switch.

The button assembly 12 is connected to the rear enclosure 16 by two prongs 31. Prongs 31 extend from the top and bottom facing surfaces of the button assembly 12. The outermost surface of each prong 31 is angled toward the central axis 'L' of the switch 11 as viewed in the rearward direction 'R.' As will be described later, the prongs 31 mate with respective openings 40 in flexible clips 35 of the rear enclosure 16.

The button circuit board assembly 14 includes a circuit board and a series of discrete buttons 32 on the front facing surface of the circuit board that physically interact with the buttons 30 of the button assembly. A series of battery contacts 33 are provided on the rear facing side of the button circuit board assembly 14 for receiving power from the batteries 20. A connector 34 is provided on the top end of the rear facing surface of the button circuit board assembly 14 for connecting to the radio circuit board assembly 15.

The radio circuit board assembly 15 includes a circuit board, a connector 36 for mating with the connector 34 of the button circuit board assembly 14, and a wireless transmitter 37. The wireless transmitter 37 is configured to wirelessly communicate with a receiver in or otherwise in communication with a luminaire, such as a lighting fixture (not shown), for example, to activate, deactivate and/or dim the light source in the lighting fixture. As noted above, switch 11 is not limited to a wireless light switch, thus, the wireless transmitter 37 could be configured to wirelessly communicate with a receiver that is connected to any type of electronic device.

The rear enclosure 16 defines an interior space 38 that is sized to accommodate the circuit board assemblies 14 and 15. The interior space 38 also includes a battery compartment for accommodating the batteries 20. A series of ribs and slots are provided along the interior surfaces of the space 38 for mounting the circuit board assemblies 14 and 15 within the space 38. Alternatively, the circuit board assemblies 14 and 15 may be fixed to the rear enclosure 16 by fasteners, for example. Flexible clips 35 extend in a forward direction 'F' from the top and bottom ends of the front facing surface of the rear enclosure 36. Each clip 35 includes a central opening 40 that is configured to receive a respective prong 31 of the button assembly 12. The button assembly 12 and the rear enclosure 16 are removably mounted together by the clip and prong arrangement.

To assemble the button assembly 12 onto the rear enclosure 16, the ramped edge of the each prong 31 is initially engaged with the surface of a respective clip 35, causing the clip 35 to flex outward (i.e., away from the central axis 'L') until the body of the prong 31 snaps into the opening 40 of the clip 35. To disassemble the button assembly 12 from the rear enclosure 16, a user manually flexes the clips 35 outward (i.e., away from the central axis 'L') and then translates the button assembly 12 in a forward direction 'F' away from the rear enclosure 16. It should be understood, however, that it is not necessary to remove the button assembly 12 from the rear enclosure 16 for replacing the batteries 20. The button assembly 12 and the rear enclosure 16 may be either permanently or releasably mounted together by any means known to those skilled in the art, such as fasteners, screws, nuts, bolts, clips, clamps, welds, adhesive, posts, slots, magnets, tracks, or pins for example.

Two L-shaped slots 42 are provided on the right and left sides of the rear enclosure 16 for releasably mating with complimentary L-shaped hooks 44 provided on the interior surface of the battery compartment cover 18. Each slot 42 includes an entrance opening 43 through which a respective hook 44 is inserted. A detent 27 is positioned above the slots 42 on the right and left sides of the rear enclosure 16 for engaging with a rounded protrusion 29 that is provided above the hooks 44 on the interior surface of the battery compartment cover 18. Each detent 27 includes a lower rim 27a extending from the side surface of the rear enclosure 16, an upper rim 27b extending from the side surface of the rear enclosure 16, and a channel (which may be either flat or convex) positioned between the lower rim 27a and the upper rim 27b for releasably captivating the rounded protrusion 29.

The battery compartment cover 18 (cover 18, hereinafter) includes interior surfaces defining an interior space 46 for accommodating one or more batteries 20. A ribbed surface 45 is provided on the exterior surface of the cover 18 for gripping and handling of the cover 18 by a user. Two L-shaped hooks 44 are defined on the right and left interior sides of the cover 18 for releasably mating with complimentary slots 42 on the rear enclosure 16. The rounded protrusions 29 (one shown) are defined on the right and left interior sides of the cover 18 for releasably mating with complimentary detents 27 on the rear enclosure 16. Each protrusion 29 is positioned on the interior surface at an elevation above the L-shaped hooks 44. Each protrusion 29 extends across a substantial portion of the width of the interior surface of the cover 18.

To assemble the cover 18 onto the rear enclosure 16, the cover 18 is first moved beneath the rear enclosure 16, and the top surfaces of the hooks 44 are brought into alignment with the entranceway 43 of the respective slots 42 of the rear enclosure 16. The cover 18 is then translated upwardly causing the hooks 44 to engage with the respective slots 42 of the rear enclosure 16. As the cover 18 is translated further upwardly, each rounded protrusion 29 passes over a respective lower rim 27a of a detent 27 causing the side walls of the cover 18 to flex outwardly until the rounded protrusion 29 snaps into the channel of the detent 27. The side walls of the cover 18 then move inwardly and return to their natural position. At the same time, the top open end 47 of the cover 18 bears on the surface 51 of the rear enclosure 16, and the cover 18 is secured to the rear enclosure 16. To disassemble the cover 18 from the rear enclosure 16, the cover 18 is translated downwards until the hooks 44 withdrawal from their respective slots 42 and the rounded protrusions 29 disengage from their respective detents 27, causing the cover 18 to separate from the rear enclosure 16.

The rear enclosure 16 includes connectors 24, in the form of ramps, for releasably connecting with the wall mount 13. The connectors 24 are positioned at the center of the forward facing edge on both the right and left sides of the rear enclosure 16. Each connector 24 includes an angled surface that is slanted outwardly (i.e., away from the central axis) as viewed in a forward direction 'F.' Two translational stops 25 are directly positioned both above and below each connector 24 for limiting translation of the switch 11 on the wall mount 13 in a direction of connection (i.e., the rearward direction 'R'). Each translational stop 25 is a rectangular protrusion, which does not include a ramped surface.

The connectors 24 and translational stops 25 are oriented such that the switch 11 may be installed onto the wall mount 13 in two different rotational orientations that are separated apart by 180 degrees. In other words, the switch 11 may connected to the wall mount 13 in both right side up and upside-down orientations. Alternatively, the connectors 24 and translational stops 25 could be positioned such that the switch 11 can only be mounted to the wall mount 13 in a single orientation.

Figure 1:
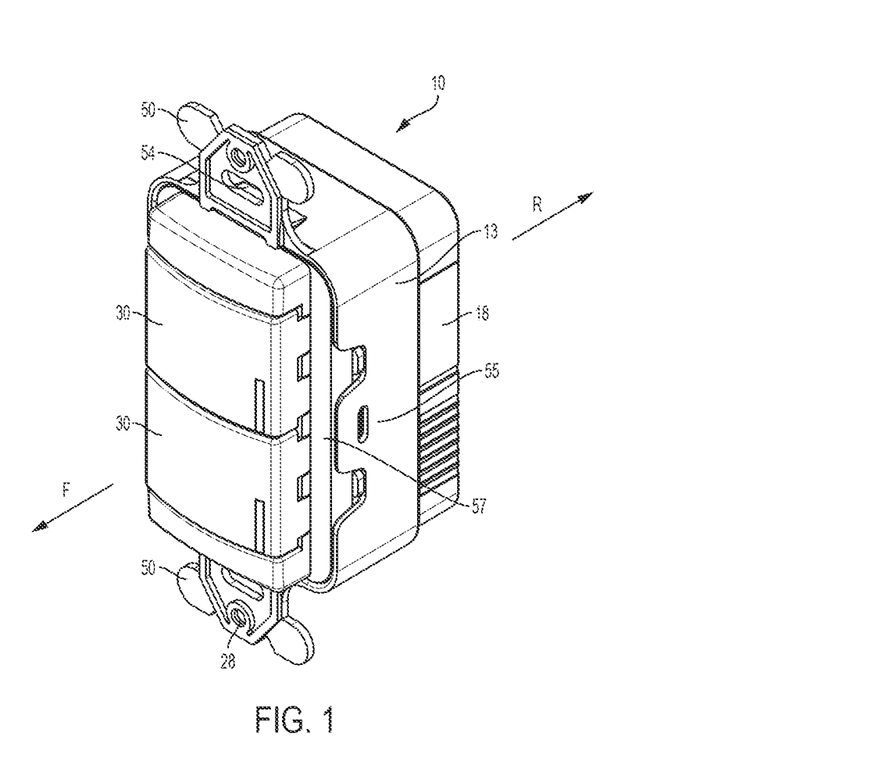
FIG. 1 depicts a perspective view taken from the top, front and right-side corner of a battery-powered wireless wall switch and wall mount therefor, which is shown assembled.
Figure 2:
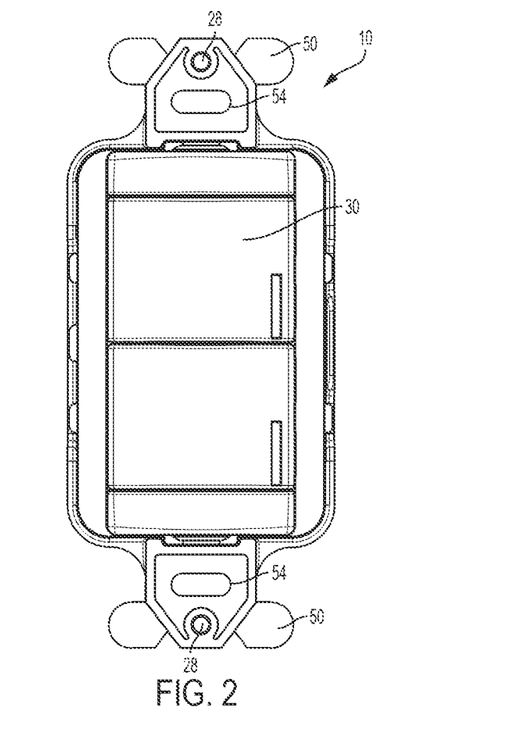
FIG. 2 depicts a front elevation view of the battery-powered wireless wall switch and wall mount therefor.

Turning now to the features of the wall mount 13, the wall mount 13 is an open four-sided rectangular shaped housing that is sized to receive and accommodate the rectangular shape of the switch 11, as best shown in FIG. 1. The wall mount 13 may be referred to as a ring.

Two posts 50 extend from the top and bottom facing surfaces of the wall mount 13. Each post 50 includes a rearward facing surface 52 (see FIG. 2) that is configured to be placed directly against a wall while the body of the wall mount 13 extends through an opening (not shown) in the wall. Alternatively, the surface 52 could be positioned directly against any surface, such as a stud or an electrical junction box. The forward facing surface 53 of each post 50 is accessible by a user upon removing a wall plate (not shown) from the wall mount 13. A wall plate is disclosed in U.S. Pat. No. 7,582,830 to Claffy, for example, which is incorporated by reference.

Each post 50 also includes an opening 28 and an elongated slot 54 that is positioned closer to the central axis 'L' than the opening 28. Each opening 28 is provided in the form of either a straight bore or a threaded hole. In use, two screws (not shown) are positioned through respective slots 54 and the screws are fixed to either the wall, a stud or an electrical junction box, for example, that is positioned rearward of surface 52, thereby securing the wall mount 13 in a fixed position within the wall. The switch 11 is then engaged with the wall mount 13, as shown in FIG. 1, such that a portion of the switch 11 extends within the wall. Thereafter, a wall plate (not shown) is positioned against the front facing surface 53 of the wall mount 13. Two screws (not shown) are then positioned through holes in the wall plate and are then fastened to respective openings 28 in the posts 50.

The wall mount 13 includes an elongated slot 26 and stop surfaces 48 and 49 for interacting with the connectors 24 and translational stops 25 of the rear enclosure 16. The elongated slot 26 is an opening that is positioned at the center of the right side 55 of the wall mount 13. The stop surfaces 48 are trapezoidal cutouts at the forward-facing edge of the right side wall 55 of the wall mount 13. The stop surfaces 48 are positioned both above and below each connector 24. The stop surface 49, in the form of a large trapezoidal cutout, is provided at the forward-facing edge of the left side wall of the wall mount 13.

The overall dimensions of the wall mount 13, as well as the position and size of the openings 28 and the elongated slots 54, may be the same as that of a common electrical box (also known as a junction box). The standard dimensions of a common electrical box may be set forth in the National Electric Code, for example. Alternatively, the overall dimensions of the wall mount 13 may be sized to fit within the interior of a common electrical box.

In use, a user connects the switch 11 (in assembled form) to the wall mount 13 by translating the body of the switch 11 in the rearward direction 'R' through the opening in the wall mount 13. In the course of translating the body of the switch 11 through the opening in the wall mount 13, the angled surface of the right side connector 24 initially engages the interior right side wall 55 of the wall mount 13, causing the right side wall 55 to flex outwardly (i.e., away from the central axis 'L') until right side connector 24 positively snaps into the elongated slot 26 of the wall mount 13. At the same time, the translational stops 25 of the switch 11 bear on respective stop surfaces 48 and 49 on the wall mount 13, thereby preventing further translation of the switch 11 in the rearward direction 'R.' Switch 11 also cannot be moved in the forward direction 'F' because a forward-facing flat stop surface of the connector 24 bears on the slot 26, thereby preventing inadvertent removal of the switch 11 from the wall mount 13.

It is noted that the left-side connector 24 does not engage any slot in the right-side up orientation of the switch 11 that is shown in the figures. However, if the switch 11 were mounted to the wall mount in an upside down orientation (i.e., a second orientation of the switch 11 that is rotationally offset by 180 degrees from the right-side up orientation shown in the figures), then the left-side connector 24 would engage with the slot 26 upon connecting the switch 11 to the wall mount 13.

To disassemble the switch 11 from the wall mount 13 (in order to replace the batteries 20, for example), a user first removes the wall cover (not shown) using a straight screwdriver, and places the tip of the same screwdriver at location 57 in a small gap between the right side wall of the switch 11 and the right side wall 55 of the wall mount 13. The user then gently flexes the right side wall 55 of the wall mount 13 in an outward direction away from the switch 11 using the screwdriver, thereby releasing the connection between the right side connector 24 and the elongated slot 26. The user then translates the switch 11 in the forward direction 'F' to separate the switch 11 from the wall mount 13. The user then removes the battery compartment cover 18 from the switch 11, replaces the batteries 20, and reinstalls the battery compartment cover 18 onto the switch 11, as previously described. The switch 11 may then be reconnected to the wall mount 13, as previously described above. It is envisioned that the right side wall 55 of the wall mount 13 may include a gripping tab such that the user can manually flex the right side wall 55 without the use of any hand tools.

Figure 3:
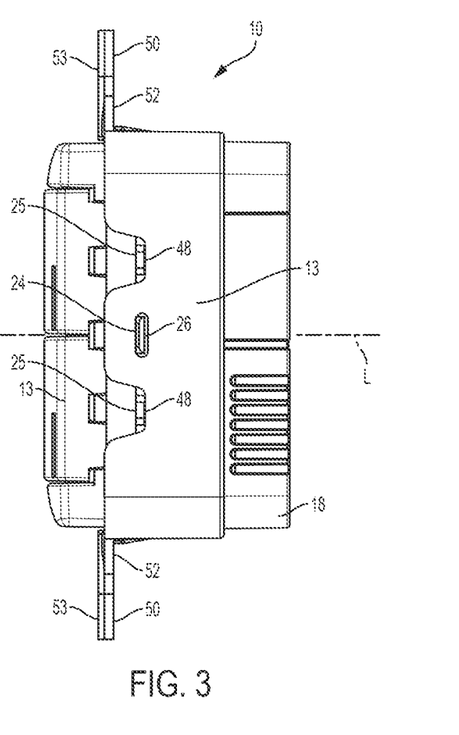
FIG. 3 depicts a right side elevation view of the battery-powered wireless wall switch and wall mount therefor.

Because the bottom end of the wall mount 13 at least partially overlaps the battery compartment cover 18 along the central axis 'L' of the assembly 10, it is not possible to remove the battery compartment cover 18 without first disconnecting the switch 11 from the wall mount 13. Accordingly, if the assembly 10 is shipped with the wall mount 13 connected to the switch 11 (as shown in FIG. 3), then the battery compartment cover 18 cannot unintentionally disengage from the assembly 10.

The connectors 24 and slot 26 for releasably connecting the switch 11 and the wall mount 13 can vary. For example, the connector 24 may be positioned on the wall mount 13 and the slot 26 may be positioned on the switch 11. More generally, the switch 11 and wall mount 13 may be releasably mounted together by any means known to those skilled in the art, such as hand operated fasteners, clips, clamps, openings, hooks, slots, magnets, tracks, or pins, for example.

The rear enclosure 16, the button assembly 12, the battery compartment cover 18 and the wall mount 13 may be manufactured by any material or process known in the art, such as casting or injection molding. The rear enclosure 16 and the wall mount 13, for example, are preferably formed from a plastic material, so that they are capable of elastic deformation upon assembling and dissembling the switch 11, as well as connecting and disconnecting the switch 11 from the wall mount 13.

The switch 11, wall mount 13 and/or a light fixture having a wireless receiver for communicating with the wireless transmitter of the switch 11 may be sold and/or distributed as a kit.

It will be understood that the terms and expressions used herein have the ordinary meaning as is accorded to such terms and expressions with respect to their corresponding respective areas of inquiry and study except where specific meanings have otherwise been set forth herein. Relational terms such as first and second and the like may be used solely to distinguish one entity or action from another without necessarily requiring or implying any actual such relationship or order between such entities or actions. The terms "comprises," "comprising," "includes," "including," or any other variation thereof, are intended to cover a non-exclusive inclusion, such that a process, method, article, or apparatus that comprises a list of elements does not include only those elements but may include other elements not expressly listed or inherent to such process, method, article, or apparatus. An element proceeded by "a" or "an" does not, without further constraints, preclude the existence of additional identical elements in the process, method, article, or apparatus that comprises the element. It will be understood that the terms "up, down, right, left, top, bottom, forward, rearward" and so on, shall be used only for the sake of clarity and that this apparatus examples may operate in various other orientations.

Unless otherwise stated, any and all measurements, values, ratings, positions, magnitudes, sizes, and other specifications that are set forth in this specification, including in the claims that follow, are approximate, not exact. They are intended to have a reasonable range that is consistent with the functions to which they relate and with what is customary in the art to which they pertain.

While the foregoing has described what are considered to be the best mode and/or other examples, it is understood that various modifications may be made therein and that the subject matter disclosed herein may be implemented in various forms and examples, and that they may be applied in numerous applications, only some of which have been described herein. It is intended by the following claims to claim any and all modifications and variations that fall within the true scope of the present concepts.

What is claimed is:

1. A battery-powered wireless electronic device comprising:
    a housing defining an interior space including a battery compartment in which one or more batteries are removably mounted;
    a wireless transmitter positioned within the interior space of the housing and electrically connected to obtain power from the one or more batteries for transmitting a wireless signal;
    a connector disposed on the housing for releasably connecting the battery-powered wireless electronic device to a wall mount that is fixedly mounted at least partially inside of the wall; and
    a removable battery compartment cover for enclosing the battery compartment, the battery compartment cover not being accessible by a user when the battery-powered device is mounted to the wall mount and the wall mount is mounted to a wall,
    wherein the battery-powered wireless electronic device is a battery-powered wireless light switch, and said battery-powered wireless light switch comprises a user-actuated button operably connected to the wireless transmitter for controlling the wireless transmitter to communicate with a receiver of a remote light fixture.

2. The battery-powered wireless electronic device of claim 1, wherein the connector comprises a ramp disposed on an exterior surface of the device that is configured to engage an opening provided on the wall mount when the housing is connected to the wall mount in a first orientation of the housing.

3. The battery-powered wireless electronic device of claim 1, wherein a portion of the housing upon which the connector is disposed is composed of a flexible material.

4. The battery-powered wireless electronic device of claim 1 wherein the user-actuated button and the removable battery compartment cover are positioned on opposite sides of the device.

5. The battery-powered wireless electronic device assembly of claim 1, wherein the connector comprises a ramp disposed on an exterior surface of the device that is configured to engage an opening provided on the wall mount when the housing is connected to the wall mount in a first orientation of the housing.

6. The battery-powered wireless electronic device assembly of claim 5, wherein the ramp includes an angled surface for engaging and flexing a wall of the wall mount, and a stop surface for positively engaging the opening of the wall mount to prevent the housing from being removed from the wall mount without first moving the wall of the wall mount to disengage the ramp from the opening.

7. The battery-powered wireless electronic device assembly of claim 6 further comprising a translational stop disposed on the housing, which is separate from the ramp, that is configured to bear on a surface of the wall mount upon connecting the housing to prevent further movement of the housing in a direction of connection.

8. A battery-powered wireless electronic device comprising:
    a housing defining an interior space including a battery compartment in which one or more batteries are removably mounted;
    a wireless transmitter positioned within the interior space of the housing and electrically connected to obtain power from the one or more batteries for transmitting a wireless signal; and
    a connector disposed on the housing for releasably connecting the battery-powered wireless electronic device to a wall mount that is fixedly mounted at least partially inside of the wall, wherein the connector comprises a ramp disposed on an exterior surface of the device that is configured to engage an opening provided on the wall mount when the housing is connected to the wall mount in a first orientation of the housing,
    wherein the ramp includes:
    an angled surface for engaging and flexing a wall of the wall mount, and
    a stop surface, which intersects the angled surface, for positively engaging the opening of the wall mount to prevent the housing from being removed from the wall mount without first moving the wall of the wall mount to disengage the ramp from the opening,
    wherein the battery-powered wireless electronic device is a battery-powered wireless light switch, and said battery-powered wireless light switch comprises a user-actuated button operably connected to the wireless transmitter for controlling the wireless transmitter to communicate with a receiver of a remote light fixture.

9. The battery-powered wireless electronic device of claim 8 further comprising a translational stop disposed on the housing, which is separate from the ramp, that is configured to bear on a surface of the wall mount upon connecting the housing to prevent further movement of the housing in a direction of connection.

10. The battery-powered wireless electronic device of claim 9 further comprising two translational stops disposed on the housing, which are positioned on opposite sides of the ramp.

11. A battery-powered wireless electronic device comprising:
- a housing defining an interior space including a battery compartment in which one or more batteries are removably mounted;
- a wireless transmitter positioned within the interior space of the housing and electrically connected to obtain power from the one or more batteries for transmitting a wireless signal; and
- a connector disposed on the housing for releasably connecting the battery-powered wireless electronic device to a wall mount that is fixedly mounted at least partially inside of the wall, wherein the connector comprises a ramp disposed on an exterior surface of the device that is configured to engage an opening provided on the wall mount when the housing is connected to the wall mount in a first orientation of the housing, wherein said ramp is disposed on one side of the housing, and a second ramp is positioned on an opposite side of the housing for engaging the opening provided on the wall mount when the housing is connected to the wall mount in a second orientation of the housing that is rotationally offset from said first orientation by 180 degrees, wherein the battery-powered wireless electronic device is a battery-powered wireless light switch, and said battery-powered wireless light switch comprises a user-actuated button operably connected to the wireless transmitter for controlling the wireless transmitter to communicate with a receiver of a remote light fixture.

\* \* \* \* \*